United States Patent [19]

Tobita

[11] Patent Number: 4,855,835
[45] Date of Patent: Aug. 8, 1989

[54] AFT CIRCUIT FOR CATV RECEIVER SYSTEM

[75] Inventor: Katsumi Tobita, Soma, Japan
[73] Assignee: Alps Electric Co., Ltd., Tokyo, Japan
[21] Appl. No.: 187,223
[22] Filed: Apr. 28, 1988

[30] Foreign Application Priority Data

Aug. 14, 1987 [JP] Japan ................................ 62-124504

[51] Int. Cl.$^4$ ......................... H04N 5/50; H04B 1/26
[52] U.S. Cl. ............................... 358/195.1; 358/191.1; 455/192; 455/316
[58] Field of Search ............... 358/191.1, 193.1, 195.1; 455/314, 315, 316, 192, 164

[56] References Cited

U.S. PATENT DOCUMENTS

| | | | |
|---|---|---|---|
| 4,388,649 | 1/1983 | Harford | 358/195.1 |
| 4,575,761 | 3/1986 | Carlson | 358/191.1 |
| 4,709,407 | 11/1987 | Baba | 455/315 |

Primary Examiner—Tommy P. Chin
Attorney, Agent, or Firm—Guy W. Shoup; Paul J. Winters

[57] ABSTRACT

An automatic fine tuning (AFT) circuit for a CATV receiver system of a double conversion type having a first local oscillator and a second local oscillator and a first mixer and a second mixer respectively supplied with oscillation outputs from the first and second local oscillators is disclosed. A reception signal is sequentially subjected to frequency conversation by use of the first and second mixers so as to attain an intermediate frequency signal of a predetermined value. The AFT circuit includes a control voltage generator for outputting a control voltage which is a function of a frequency fluctuation of the intermediate frequency signal; a selector for selecting either the control voltage or a constant voltage and for supplying the selected voltage as an oscillation frequency control voltage controlling the oscillation frequency of the second local oscillator; an integration unit for integrating the oscillation frequency control voltage so as to produce an integrated control voltage; and a voltage comparator for comparing the integrated control voltage with a reference voltage so as to supply a result of the comparison to the selector. In response to the compare result from the voltage comparator, the selector supplies the control voltage to the second local oscillator when the integrated voltage is higher than the reference voltage and supplies the constant voltage to the second local oscillator when the integrated voltage is lower than the reference voltage.

3 Claims, 2 Drawing Sheets ns of a frequency band associated with a free channel of the television broadcasting in the VHF or UHF band so as to be delivered to an antenna terminal of a television receiver.

AFT CIRCUIT FOR CATV RECEIVER SYSTEM

BACKGROUND OF THE INVENTION

1. Field of the Invention

The present invention relates to a cable television (CATV) receiver system of a double conversion method for receiving CATV broadcasting signals, and in particular, to an automatic fine tuning (AFT) circuit for keeping at a predetermined value a frequency of a second intermediate frequency signal delivered from a tuner of the CATV receiving system.

2. Description of the Prior Art

In general, in a CATV receiver system (for example, a CATV converter) for receiving the CATV broadcasting signals, there is adopted a double conversion method to prevent the unnecessary emission of signals from a local oscillator and to attain various performances of a tuner (front end) section.

FIG. 4 is a block diagram showing a configuration of a CATV receiver system of this kind. In this configuration, a receive signal (frequency fRF) selected by a tuning circuit (not shown) from high-frequency signals supplied via a coaxial cable from a broadcasting station is supplied to a first mixer M1 of the tuner 1 so as to be mixed with an oscillation output (frequency $fosc_1$) of a first local oscillator L1, thereby producing a fist intermediate frequency signal (frequency $fIF_1 = fosc_1 - fRF$). Subsequently, the first intermediate frequency signal is mixed in a second mixer M2 with an oscillation output signal (frequency $fosc_2$) from a second local oscillator L2, thereby producing a second intermediate frequency signal (frequency $fIF_2 = fIF_1 - fosc_2$). The first and second local oscillators L1 and L2 include voltage control oscillators (VCOs), respectively such that the oscillation frequency $fosc_1$ of the first local oscillator L1 is set by means of a tuning system 2. The tuning system 2 includes a tuning button, a micro-computer, and the like to select a reception channel, so that when a reception channel is selected by the tuning button, a voltage necessary to attain the first local oscillation frequency $fowc_1$ corresponding to a frequency of the selected reception channel is applied to a variable capacitance (variable capacity diode) functioning as a portion of the tuning capacitance of the first local oscillator L1. A second intermediate frequency outputted from the second mixer M2 of the tuner 1 is supplied to a demodulation circuit 4 via a band-pass filter 3 constituted with a surface acoustic wave (SAW) filter. The band-pass filter 3 has a characteristic to pass a voice intermediate frequency $fIF_{2s}$ (41.25 MHz) and a video intermediate frequence $fIF_{2p}$ (45.75 MHz), an adjacent channel interference prevention characteristic necessary to efficiently prevent an interference with an adjacent channel, and a characteristic such as the Nyquist strobe required to correct the frequency of a television signal transmitted in the vestigial side-band transmission system. The demodulation circuit 4 comprises a video detection circuit to detect a video signal component of the second intermediate frequency signal supplied via the bandpass filter 3 and a voice detecion circuit to detect a voice signal component thereof so as to respectively output video and voice signals of the base band from which the carrier signal is removed. The video and voice signals of the base band are demodulated by a demodulation circuit (not shown) into signals of a frequency band associated with a free channel of the television broadcasting in the VHF or UHF band so as to be delivered to an antenna terminal of a television receiver.

Incidentally, the conversion of the video and voice signals into signals of the base band is achieved for the following reasons. ① In a CATV system, to prevent nonsubscribers other than those who have paid the fee of the broadcasting from illegally televiewing the broadcasting, a scramble processing is effected on the side of the broadcasting station. On the receiver side, a descramble operation is accomplished in the base band to restore the original screen. ② In order to enable a sound volume adjustment by an operation on the CATV receiver system without necessitating the operation of the sound volume control on the television receiver side, the voice signal level is adjusted through the base-band conversion. ③ The receiver system is enabled to obtain various data superimposed onto the television signals sent from the broadcasting station.

In the configuration above, when the oscillation frequencey $fosc_2$ of the second local oscillator or the first intermediate frequency $fIF_1$ shifts from the predetermined value, the second intermediate frequency $fIF_2$ is changed and hence cannot correctly pass the hand-pass filter 3. Particularly, when the second intermediate frequency $fIF_2$ is changed to a higher value, the video intermediate frequency $fIF_{2p}$ (predetermined value 45.75 MHz) becomes to be beyond the band pass of the band-pass filter 3 even if the change is small. As a result, the demodulation circuit 4 cannot attain the normal video signal.

To prevent this disadvantageous phenomenon, there is disposed an AFT circuit 5 for continuously keeping at a predetermined value the second intermediate frequency $fIF_2$ delivered from the tuner 1. The AFT circuit 5 detects the amount of fluctuation of the second intermediate frequency $fIF_2$ from the normal value so as to supply the second local oscillator L2 with an oscillation frequency control voltage (to be referred to as an AFT voltage herebelow) VAFT proportional to the amount of fluctuation, thereby controlling the second local oscillation frequency $fosc_2$. The AFT circuit 5 comprises an FM. detection circuit 6, an AFT defeat circuit 7, and an AFT clam circuit 8. The FM detect circuit 6 achieves an FM detection on the video intermediate frequency signal of the second intermediate frequency signal so as to output as the AFT voltage VAFT a detection output voltage corresponding to the change of the video carrier frequency as shown in FIG. 5. The AFT defeat circuit 7 is disposed to invalidate the AFT operation in the channel select operation for preventing a wrong operation, and in an ordinary case, the the AFT voltage VAFT supplied from the FM detect circuit 6 is directly delivered to the AFT clamp circuit 8. On the other hand, during a defeat period of time beforehand set corresponding to a channel selection period of time required to be elapsed from when the channel selection button of the channel selector 2 is activated to when the oscillation frequency $fosc_1$ is set, the AFT voltage VAFT is fixed to a constant defeat voltage Vd so as to set the second local oscillation frequency $fosc_2$ of the second local oscillator L2 to a fixed value. Furthermore, the AFT clamp circuit 8 is disposed to establish the lower limit value of the AFT voltage VAFT and is constituted as shown in FIG. 6 with resistors $R_1$ and $R_2$ for dividing the power source voltage VB, a capacitor $C_1$, and a diode D. Moreover, the clam voltage Vc developed at a connection point between the resistors $R_1$ and $R_2$ is expressed as follows.

$$Vc = \frac{R_2}{R_1 + R_2} \cdot VB \quad (1)$$

Assuming here the voltage drop of the diode D in the forward direction thereof to be VF (about 0.6 V), the AFT voltage VAFT delivered via the AFT clamp circuit 8 cannot be equal to or less than $Vc-VF$. In addition, the AFT voltage VAFT supplied from the AFT circuit 5 constructed as described above is applied to a variable capacitor functioning as a portion of the tuning capacitance of the second local oscillator L2 so as to control the second local oscillation frequency $fosc_2$.

In a case, for example as shown in FIG. 7, where the video frequency fRFp of the reception signal is 61.25 MHz and the voice or sound frequency fRFs thereof is 65.75 MHz, if the first local oscillation frequency $fosc_1$ is set to 762.6 MHz, the voice intermediate frequency $fIF_1s$ and the video intermediate frequency $fIF_1p$ of the first intermediate frequency signal are attained as 696.85 MHz and 701.35 MHz, respectively. Furthermore, if the second local oscillation frequency $fosc_1$ is set to 655.6 MHz, the voice intermediate frequency $fIF_2s$ and the video intermediate frequency $fIF_2p$ of the second intermediate frequency signal are attained as 41.25 MHz and 45.75 MHz, respectively. Moreover, the defeat voltage Vd outputted from the AFT defeat circuit 7 in the channel selection is set such that the second local oscillation frequency $fosc_2$ develops a value (for example, 656 MHz) slightly higher than the predetermined value 655.6 MHz. As a result, when the AFT voltage VAFT increases, the second local oscillation frequency $fosc_2$ increases and the second intermediate frequency $fIF_2$ decreases; consequently, the video intermediate frequency $fIF_2p$ of the second intermediate frequency signal is set to a value slightly lower than the predetermined value 45.75 MHz.

Incidentally, during a reception by means of the CATV receiver described above, when the transmission from a broadcasting station is temporarily interrupted due to a check of a transmission system of the station or a failure of a coaxial cable, the reception signal becomes to be missing and hence an AFT lockout takes place. The AFT lockout is a phenomenon in which the second intermediate frequency $fIF_2$ greatly shifts from the normal value and becomes to be beyond the pass band of the band-pass filter 3, the AFT circuit 5 consequently cannot detect the amount of fluctuation of the second intermediate frequency $fIF_2$, and hence the second intermediate frequency $fIF_2$ cannot be corrected to the normal value. In addition, when the AFT lockout occurs, the receiver system is kept remained in the reception disabled state even when the transmission is restarted. Furthermore, a state where the AFT circuit 5 is not set to the loackout and hence the second intermediate frequency $fIF_2$ can be corrected is called an AFT capture range, which is determined according to the pass band characteristic of the band-pass filter 3. As a cause of the AFT lockout, there may be considered a wrong operation of the AFT circuit due to a beat signal generated by a distortion or the like in the tuner 1 caused by a noise component or a multichannel input. In this case, the AFT circuit 5 ordinarily operates to lower the AFT voltage VAFT. Furthermore, the AFT lockout appears in a case where the channel selection time does not match with the defeat time beforehand set for the channel selection.

In order to effectively prevent the AFT lockout, it is only necessary to set the clamp voltage Vc of the AFT clamp circuit 8 to a higher value and the lower limit $Vc-VF$ of the AFT voltage VAFT to a higher value. However, when the clamp voltage Vc is set to a higher value, the capture range of the AFT circuit 5 determined by the pass band characteristic of the band-pass filter 3 is narrowed, which leads to a problem that the system cannot cope with the total error (about 1 MHz in an ordinary case) including the errors of the first local oscillation frequency $fosc_1$, the reception frequency fRF, and the second local oscillation frequency $fosc_2$. Moreover, when the AFT voltage VAFT becomes to be similar to the clamp voltage Vc, a noise is superimposed onto the AFT voltage VAFT, which leads to a problem that a wrong operation is developed by the AFT circuit.

SUMMARY OF THE INVENTION

It is therefore an object of the present invention to provide an AFT circuit of a CATV receiving system which can efficiently prevent the AFT lockout caused by the interruption of the reception signal or the like while retaining a desired capture range with a satisfactory width and which is further capable of preventing the wrong operation associated with the superimposed noise in the AVT voltage, thereby removing the disadvantages described above.

According to the present invention, in a CATV receiver system of a double conversion method having a first local oscillator and a second local oscillator and a first mixer and a second mixer respectively supplied with oscillation outputs from said first and second local oscillators such that a reception signal is sequentially subjected to a frequency conversion by use of said first and second mixers so as to attain a second intermediate frequency signal of a predetermined frequency, there are disposed control voltage generate means for outputting a control voltage depending on a frequency fluctuation of said second intermediate frequency signal, select means for selecting either said control voltage or a constant voltage and for supplying the selected voltage as an oscillation frequency control voltage controlling an oscillation frequency of said second local oscillator to said second local oscillator, integrate means for integrating said oscillation frequency control voltage so as to produce as an output therefrom an integrated voltage attained through the integration, and voltage compare means for comparing said integrated voltage with a reference voltage so as to supply a result of the comparison to said select means wherein said select means operative based on said compare result from said voltage compare means supplies said control voltage to said second local oscillator when said integrated voltage is higher than said reference voltage and supplies said constant voltage to said second local oscillator when said integrated voltage is lower than said reference voltage.

In a process where the reception signal is interrupted and the control voltage supplied from the control voltage generate means is slowly decreased, which causes an AFT lockout, each time the integrated voltage becomes to be equal to or less than the reference voltage in association with the decrease of the control voltage, the select means is changed over based on the comparison result from the voltage compare means to temporarily increase the oscillation frequency control voltage up to the constant voltage in a forcible fashion, which leads to a state where the oscillation frequency control voltage varies from the constant voltage to the reference voltage at a fixed cycle. Thereafter, when there is again restored a state where the reception signal is inputted, the system is restored from the AFT lockout so as to restart the normal AFT operation.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Referring now to the accompanying drawings, a description will be given of embodiments according to the present invention.

Figure 1:
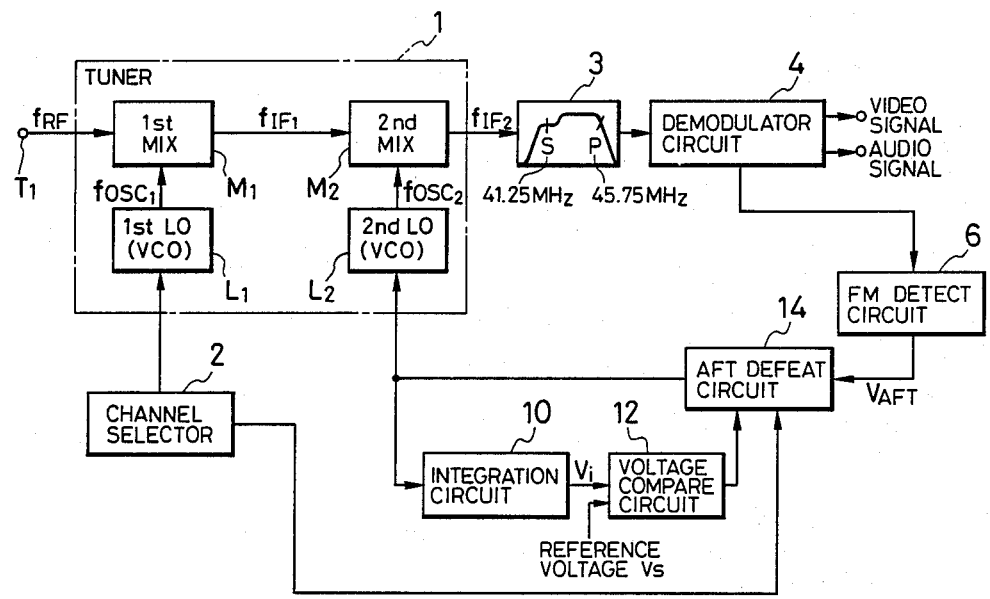
FIG. 1 is a schematic block diagram showing the configuration of an embodiment according to the present invention.

FIG. 1 is a diagram showing the configuration of an embodiment according to the present invention in which the components appearing in the foregoing explanation will be assigned with the same reference numerals and the description thereof will be omitted.

Figure 2:
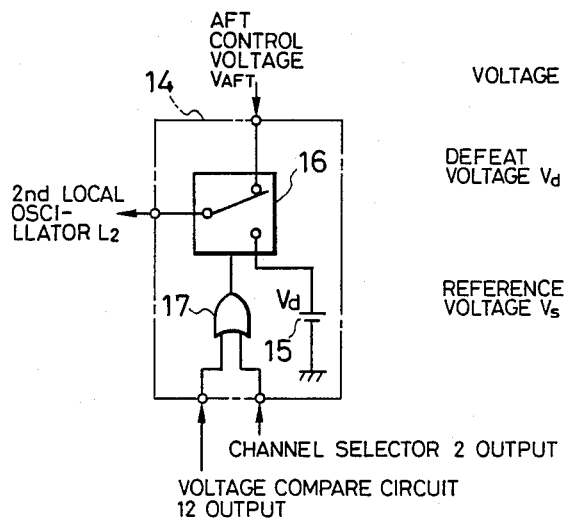
FIG. 2 is a block diagram schematically showing a constitution of the AFT defeat circuit 14 of the embodiment of FIG. 2.

The configuration of FIG. 1 includes an integration circuit 10 for integrating the AFT voltage VAFT to be supplied to the second local oscillator L2 via the AFT defeat circuit 14, which will be described later in this specification. The integrator circuit 10 removes the noise component superimposed onto the AFT voltage VAFT and further determines the variation cycle of the AFT voltage VAFT in a case of the AFT lockout, which will be described later. Reference numeral 12 denotes a voltage compare circuit for comparing an integrated voltage Vi delivered from the integration circuit 10 with a reference voltage Vs. When the integrated voltage Vi becomes to be equal to or less than the reference voltage Vs, the output from the voltage compare circuit 12 is reversed from the "L" level to the "H" level. In this case, the reference voltage Vs is appropriately set according to the capture range required and the voltage compare circuit 12 is provided with a hyisteresis characteristic to attain a desired noise margin. Reference numeral 14 denotes an AFT defeat circuit comprising, as shown in FIG. 2, a reference voltage source 15 outputting a constant defeat voltage Vd, a selection circuit 16 selecting either the AFT voltage VAFT supplied from the FM detect circuit 6 or the defeat voltage Vd delivered from the reference voltage source 15 so as to produce an output signal, and an OR gate 17 achieving a logic operation of OR between an output from the channel selector 2 and an output from the voltage compare circuit 12. When the output from the OR gate 17 is set to the "H" level, the selecting circuit 16 is changed over to a reverse state from the state of FIG. 2. The channel selector 2 supplies here a signal of the "H" level to the AFT defeat circuit 14 until the preset defeat time is elapsed from when the channel selection button is depressed. Furthermore, the AFT defeat voltage Vd is set such that the second local oscillation frequency $fosc_2$ is set to a value (for example, 656 MHz) slightly higher than the normal value 655.6 MHz. As a result, the video intermediate frequency $fIF_2$ of the second intermediate frequency signal is set to a value slightly lower than the normal value 45.75 MHz.

Figure 3:
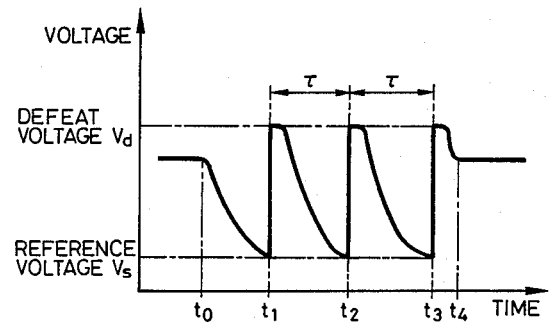
FIG. 3 is a graph showing a waveform useful to explain the operation of the embodiment.
Figure 4:
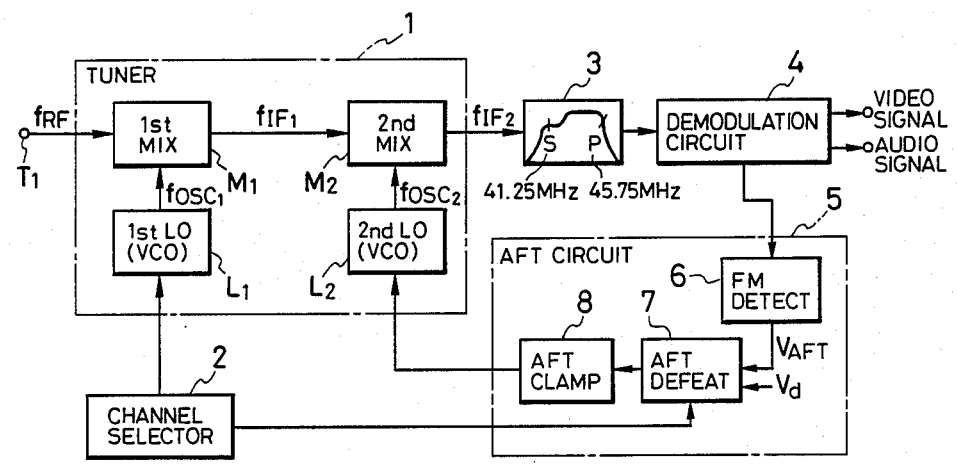
FIG. 4 is a block diagram showing a configuration of the tuner 1 and the AFT circuit 5 of a conventional CATV receiving apparatus.
Figure 5:
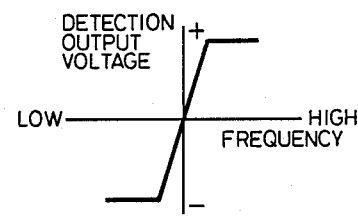
FIG. 5 is a graph showing an output waveform from the FM detect circuit 6 of the AFT circuit 5.
Figure 6:
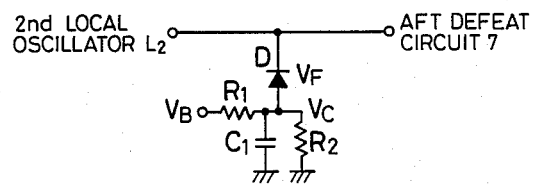
FIG. 6 is a circuit diagram showing the constitution of the AFT clamp circuit 7 of the AFT circuit 5.
Figure 7:
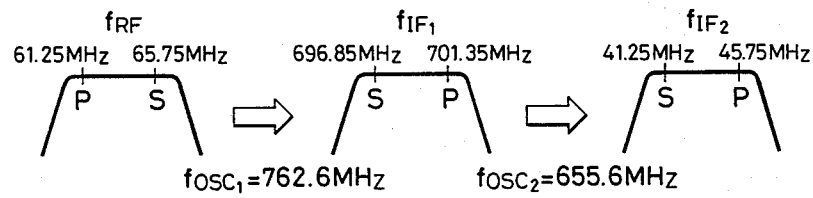
FIG. 7 is an explanatory diagram useful to explain frequencies developed at the respective sections of the tuner 1.

Next, referring to the configuration described above, a description will be given of the operation in a case where the transmission from te broadcasting station is temporarily interrupted during the reception with reference to FIG. 3.

First, when the reception signal is interrupted at a time $t_0$, the AFT voltage VAFT outputted from the FM detect circuit 6 is gradually lowered, which leads to the AFT lockout. Thereafter, when the AFT voltage VAFT becomes to be equal to or less than the reference voltage Vs at a time $t_1$, the output from the voltage compare circuit 12 is reversed to the "H" level. When the signal at the "H" level is supplied via the OR gate 17 to the selection circuit 16, the selection circuit 16 supplies the second local oscillator L2 with the defeat voltage Vd in place of the AFT voltage VAFT. This causes the integrated voltage Vi outputted from the integration circuit 10 to be temporarily used for the defeat voltage Vd and the reference voltage Vs is exceeded. As a result, the output from the voltage compare circuit 12 is reversed to the "L" level and hence the selection circuit 16 supplies the second local oscillator L2 with the AFT voltage VAFT in place of the defeat voltage Vd. Thereafter, the AFT voltage VAFT is gradually lowered to be equal to or less than the reference voltage Vs at a time $t_2$. At this point, the output from the voltate compare circuit 12 is reversed again to the "H" level. In this fashion, the AFT voltage VAFT graddually lowers from the defeat voltage Vd to the reference voltage Vs at a cycle $\tau$ of time represented by $t_2 - t_1$. This is also the case in the next cycle ranging from $t_2$ to $t_3$. In this case, the cycle $\tau$ is about five times the time constant of the integration circuit 10. As described above, the AFT voltage VAFT changes in a saw-tooth form with the cycle, namely, a sweep state is established. In this state, the system waits for a reception signal. Subsequently, when the transmission is restarted and the AFT voltage VAFT is restored to a value substantially identical to the original value (the value prior to the time $t_0$) at the time $t_3$, the system is restored from the AFT lockout and restarts the normal AFT operation.

As described above, according to the present invention, in a process where the reception signal is interrupted and the control voltage supplied from the control voltage generate means is gradually lowered, each time the integrated voltage becomes to be equal to or less than the reference voltage in association with the decrease of the control voltage, the selection means changes over based on the comparison result from the voltage compare means so as to forcibly increase the AFT voltage up to a constant voltage, thereby causing the variation of the AFT voltage from the constant voltage to the reference voltage to be repeatedly effected with a predetermined cycle, which leads to the following effects.

① Even when an AFT lockout occurs due to an interruption of the reception signal or the like at a point of time when the transmission is restarted, the system can be restored from the AFT lockout and can proceed to the normal AFT operation again.

② The operation above is also effective in an AFT lockout causes by a mismatching between the time required for the channel select operation in a channel selection state and the defeat time beforehand set, namely, an appropriate channel select operation can be accomplished.

③ By setting the reference voltage to a lower value, a desired capture range can be attained with a satisfactory width.

④ Since the noise superimposed onto the AFT voltage is removed by the integration means, the wrong operation which may be caused by the superimposed noise can be prevented.

While the present invention has been described with reference to the particular illustrative embodiments, it is not restricted by those embodiments but only by the appended claims. It is to be appreciated that those skilled in the art can change and modify the embodiments without departing from the scope and spirit of the present invention.

What is claimed is:

1. An AFT circuit of a CATV receiver system of a double conversion method having a first local oscillator and a second local oscillator and a first mixer and a second mixer respectively supplied with oscillation outputs from said first and second local oscillators such that a reception signal is sequentially subjected to a frequency conversion by use of said first and second mixers so as to attain a second intermediate frequency signal of a predetermined frequency comprising:

control voltage generate means for outputting a control voltage depending on a frequency fluctuation of said second intermediate frequency signal;

select means for selecting either said control voltage or a constant voltage and for supplying the selected voltage as an oscillation frequency control voltage controlling an oscillation frequency of said second local oscillator to said second local oscillator;

integrate means for integrating said oscillation frequency control voltage so as to produce as an output therefrom an integrated voltage attained through the integration; and voltage compare means for comparing said integrated voltage with a reference voltage so as to supply a result of the comparison to said select means wherein said select means operative based on said compare result from said voltage compare means supplies said control voltage to said second local oscillator when said integrated voltage is higher than said reference voltage and supplies said constant voltage to said second local oscillator when said integrated voltage is lower than said reference voltage.

2. An AFT circuit according to claim 1 wherein said control voltage generate means is an FM detection circuit.

3. An AFT circuit according to claim 1 wherein said select means, said integrate means, and said voltage compare means are a selector circuit, an integration circuit, and a voltage comparator circuit, respectively.

* * * * *